(12) United States Patent
Yoshii

(10) Patent No.: US 6,210,868 B1
(45) Date of Patent: Apr. 3, 2001

(54) METHOD FOR FORMING A PATTERN ON A CHEMICAL SENSITIZATION PHOTORESIST

(75) Inventor: Tsuyoshi Yoshii, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/187,855

(22) Filed: Nov. 6, 1998

(30) Foreign Application Priority Data

Nov. 6, 1997 (JP) .................................................. 9-304546

(51) Int. Cl.$^7$ .................................................. G03F 7/40
(52) U.S. Cl. ........................... 430/325; 430/330; 430/945
(58) Field of Search .................................. 430/330, 311, 430/322, 945, 325, 324

(56) References Cited

U.S. PATENT DOCUMENTS 5,385,809 * 1/1995 Bohrer et al. .................. 430/311
5,580,695 * 12/1996 Murata et al. .................. 430/270.1

FOREIGN PATENT DOCUMENTS

| 0524759A1 | * 1/1993 | (EP) . |
| 4-364021 | 12/1992 | (JP) . |
| 6-275514 | 9/1994 | (JP) . |
| 9-160259 | 6/1997 | (JP) . |
| 10-246959 | 9/1998 | (JP) . |
| 10-333341 | 12/1998 | (JP) . |

* cited by examiner

*Primary Examiner*—Kathleen Duda
(74) *Attorney, Agent, or Firm*—Hayes, Soloway, Hennessey, Grossman & Hage, P.C.

(57) ABSTRACT

A method for forming a fine pattern on a chemical sensitization photoresist includes the consecutive steps of exposing a photoresist film with KrF excimer laser, developing the exposed photoresist film to form a photoresist pattern, separating protective group from the photoresist pattern, and heating the photoresist film to make the photoresist pattern to have a swelling property, thereby reshaping the openings in the photoresist pattern while reducing the size of the openings. The method achieves a finer pattern in a design rule of 0.30 to 0.18 $\mu$m without degradation of the shape.

6 Claims, 1 Drawing Sheet

METHOD FOR FORMING A PATTERN ON A CHEMICAL SENSITIZATION PHOTORESIST

BACKGROUND OF THE INVENTION (a) Field of the Invention

The present invention relates to a method for forming a pattern on a chemical sensitization photoresist and, more particularly, to a method for forming a pattern on a chemical sensitization photoresist to obtain a photoresist mask used as an etching mask or an ion-implantation mask on a semiconductor substrate.

(b) Description of the Related Art

A higher integration and a higher-speed operation have been achieved in the field of semiconductor devices by obtaining finer patterns for device element using a photolithographic technique. The conventional semiconductor devices using a design rule of 0.5 µm are fabricated by g-line lithography using an exposure wavelength of 436 nm, whereas semiconductor devices using a design rule of 0.5 to 0.35 µm are fabricated by i-line lithography using an exposure wavelength of 365 nm.

Next generation semiconductor devices to be developed in the near future may be fabricated in a design rule of 0.30 to 0.18 µm. A KrF excimer laser lithography using an exposure wavelength of 248 nm is expected to provide such a finer design rule.

Conventional photolithographic techniques generally provided patterns of respective design rules larger than the exposure wavelength used in the photolithographic techniques. On the other hand, the KrF excimer laser is expected to provide a pattern in a finer design rule of 0.18 µm which is smaller than the wavelength 248 nm of the KrF excimer laser. In such a case, problems of insufficient resolution and depth of focus should be considered.

The resolution R and the depth of focus (DOF) are represented as follows:

$$R = k_1 \cdot \lambda / NA,$$

and $$DOF = k_2 \cdot \lambda / (NA)^2,$$

wherein $\lambda$ and NA are exposure wavelength and numerical aperture, respectively, of the exposure system, and $k_1$ and $k_2$ are constants.

In the above formulae, the resolution R can be improved by employing a smaller exposure wavelength and a larger numerical aperture, whereas the DOF suddenly decreases along with the smaller exposure wavelength and the larger numerical aperture. That is, the resolution R and DOF in the exposure system are tradeoffs.

In addition, it is generally difficult in a KrF excimer laser lithography to use a positive type photoresist, obtained as a compound of novolac resin and naphthoquinone-diacido, which has been used in the g-line and i-line lithographies. This is because novolac resin has a large optical absorption for light having wavelength of 248 nm, and cannot provide a suitable profile having a sharp vertical edge.

In view of the above, active researches have been conducted to obtain a new type photoresist that is called chemical sensitization photoresist. The chemical sensitization photoresist is made from a base resin, an acid generator which generates acid during exposure thereof, and a compound having a protective group which changes solubility of the compound for a developing solution depending on the amount of acid. The base resin is generally selected from phenolic resins having a high transmission factor to light having a 248 nm wavelength.

As one of the techniques for forming a finer pattern using a chemical sensitization photoresist that exceeds the conventional patterning technique, Patent Publication JP-A-4-364021 proposes a method for heating the photoresist up to around the softening point thereof after the patterning thereof to swell the photoresist to obtain a finer pattern.

In the proposed technique, however, the heating of the photoresist up to the softening point thereof causes problems of degradation in the profile and insufficient controllability of the dimensions in the resultant photoresist pattern.

SUMMARY OF THE INVENTION

In view of the above, it is an object of the present invention to provide a method for forming a pattern on a chemical sensitization photoresist, which is capable of providing an excellent profile and excellent controllability of the dimensions.

The present invention provides a method for forming a pattern on a chemical sensitization photoresist film comprising the consecutive steps of exposing a photoresist film through a mask pattern, developing the exposed photoresist film to form a photoresist pattern, separating a protective group from the photoresist pattern, and heat treating the photoresist pattern.

In accordance with the method of the present invention, providing the step of separating the photoresist group from the photoresist pattern separately from heat treating the photoresist pattern to swell the photoresist pattern can achieve improvement of the resolution and controllability of the dimensions. The present invention is based on the finding that the heating of the chemical sensitization photoresist up to the softening temperature thereof causes simultaneous separation of protective group and swelling of the photoresist, which degraded the resolution and controllability of the photoresist in the conventional technique.

The above and other objects, features and advantages of the present invention will be more apparent from the following description, referring to the accompanying drawings.

PREFERRED EMBODIMENTS OF THE INVENTION

Figure 1:
FIGS. 1 to 4 are sectional views showing patterning steps of a semiconductor device in a process according to an embodiment of the present invention.
Figure 1:
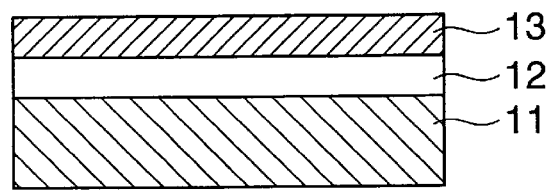

Now, the present invention is more specifically described with reference to preferred embodiments of the present invention.

In a preferred embodiment of the present invention, a chemical sensitization photoresist film formed on a substrate is subjected to exposure by KrF excimer laser through a mask having a pattern, followed by heating the photoresist film together with the substrate to cause a catalytic reaction in the exposed area. Subsequently, the photoresist film is developed with an alkaline aqueous solution for fixing the pattern on the photoresist film. Thereafter, patterned photoresist film (photoresist pattern) together with the substrate is maintained in an acidic solution or an acidic ambient atmosphere for a specified length of time, thereby separating the protective group from the photoresist pattern by desorption. After the desorption of the protective group, the photoresist pattern has an excellent quality of susceptibility for swelling.

Subsequently, the photoresist pattern together with the substrate is heated to swell the photoresist pattern, thereby reshaping the openings in the photoresist pattern, such as contact holes or spaces, while reducing the openings in their dimensions. By the above steps, an excellent pattern of a smaller design rule can be obtained on the chemical sensitization photoresist film substantially without degradation in the shape of the resultant photoresist pattern.

The desorption of the protective group is effected during the step of soaking the developed photoresist in an acidic solution or the step of exposing the developed photoresist to an acidic gas. The protective group is one of functional groups forming a chemical sensitization photoresist. After the protective group is separated from the chemical sensitization photoresist by desorption using an acid, the photoresist becomes susceptible to swelling during heating of the photoresist. The contact of the photoresist may be either to a liquid phase or to a gas phase of acid. Generally, the liquid phase is more preferable than the gas phase in view of the throughput. However, if the acid has a relatively smaller molecular weight, a practical reaction rate can be obtained from the gas phase as well as the liquid phase.

The desorption of the protective group may be conducted while warming the photoresist film up to a suitable temperature. The reaction rate generally increases with the rise of the ambient temperature. That is, the warming or calefactory of the substrate to a suitable temperature improves throughput in the desorption. However, a higher temperature in the warming generates reflow of the photoresist film, which is undesirable.

Referring to FIGS. 1 to 4, there are shown consecutive steps in a method for forming a photoresist pattern on a chemical sensitization photoresist according to the embodiment of the present invention.

EXAMPLE 1

In a first example according to the embodiment, chemical sensitization photoresist (TDUR-P009 from Tokyo Oka Industry Co.) for KrF excimer laser is applied onto an oxide film 12 formed on a semiconductor substrate 11 to form a 1.0 $\mu$m-thick photoresist film 13, followed by exposure thereof using KrF excimer laser through a mask 14.

Figure 2:
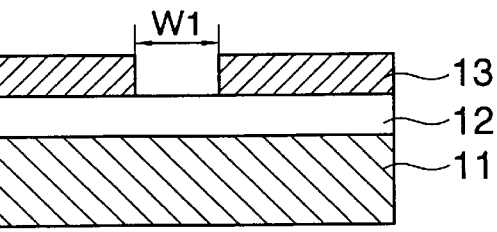
Figure 3:
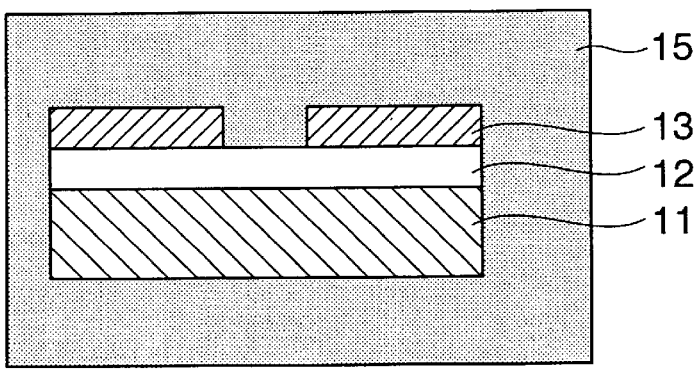
Figure 4:
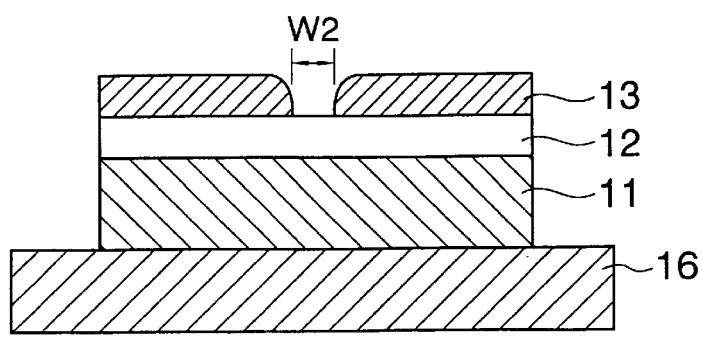

Subsequently, warming of the photoresist film after exposure is conducted at a temperature of 110° C. for 90 seconds, followed by development using 2.38% aqueous solution of tetramethyl ammonium hydroxide (TMAH) for 60 seconds to form a photoresist pattern, as shown in FIG. 2. The width of the opening thus formed is W1. Thereafter, the photoresist pattern is soaked in 0.01 normal sulfonic acid aqueous solution 15 at 90° C. for 120 seconds for desorption of the protective group under calefactory, as shown in FIG. 3. The photoresist pattern is then subjected to a heat treatment using a hot plate 16 at 180° C. for 120 seconds, as shown in FIG. 4, thereby swelling the photoresist pattern.

In the resultant photoresist pattern, the width of the opening is reduced from W1 to W2 where W2−W1=0.1 $\mu$m.

EXAMPLE 2

In a second example of the embodiment, chemical sensitization photoresist (KRF-K2G from Japan Synthetic Resin Co.) for KrF excimer layer is applied onto an oxide film 12 formed on a semiconductor substrate 11 to form a 1.0 $\mu$m-thick photoresist film 13, followed by exposure using KrF excimer laser through a mask 14.

Subsequently, warming of the photoresist after exposure is conducted at a temperature of 100° C. for 90 seconds, followed by development using 2.38% aqueous solution of TMAH for 60 seconds to form a photoresist pattern, as shown in FIG. 2. Thereafter, the photoresist pattern is maintained in 1 ppm nitric acid gas ambient 15 at 25° C. for 60 seconds, followed by a warming treatment of the photoresist film using a hot plate at 100° C. for 120 seconds for desorption of the protective group from the photoresist pattern. The photoresist pattern is then subjected to a heat treatment at a temperature of 200° C. for 120 seconds, thereby swelling the photoresist pattern. In the resultant photoresist pattern, the width of the opening is reduced from W1 to W2 where W2−W1=0.05 $\mu$m.

In the first and second examples, excellent fine photoresist patterns can be obtained substantially without degradation of the shape. In a modification from the first embodiment, for example, the calefactory using the 0.01 normal sulfonic acid aqueous solution at 90° C. for 120 seconds as used in the first embodiment may be replaced by soaking the photoresist pattern into a sulfonic acid aqueous solution at 25° C., followed by calefactory at 110° C. for 90 seconds. Examples of the chemical sensitization photoresist include known photoresist used for an i-line lithography, ArF excimer laser, electron beam, and X-ray.

Since the above embodiments are described only for examples, the present invention is not limited to the above embodiments and various modifications or alterations can be easily made therefrom by those skilled in the art without departing from the scope of the present invention.

What is claimed is:

1. A method for forming a pattern on a chemical sensitization photoresist film comprising the following steps, in the sequence of:

(A) exposing a photoresist film through a mask pattern, (B) developing the exposed photoresist film to form a photoresist pattern, (C) desorbing protective groups from the photoresist by exposing the formed photoresist pattern to an acid, and (D) heat treating the photoresist pattern after the desorption of protective groups whereby to swell the photoresist pattern and reshape openings in the photoresist pattern and reduce dimensions of the openings.

2. The method as defined in claim 1, wherein step (C) comprises soaking the photoresist pattern in an acidic solution.

3. The method as defined in claim 2, wherein step (C) is conducted while warming the photoresist pattern.

4. The method as defined in claim 1, wherein step (C) comprises exposing the photoresist pattern to an acidic gas.

5. The method as defined in claim 4, wherein step (C) is conducted while warming the photoresist pattern.

6. The method as defined in claim 1, wherein said exposing step uses KrF excimer laser.

* * * * *